United States Patent [19]
Tabata

[11] Patent Number: 5,965,870
[45] Date of Patent: Oct. 12, 1999

[54] IMAGE READING SYSTEM WITH MEANS FOR CONVERGING LIGHT FROM A PLURALITY OF LIGHT SOURCES ON A SUBSTANTIALLY SAME POSITION TO UNIFORMLY IRRADIATE AN OBJECT

[75] Inventor: Masami Tabata, Isehara, Japan

[73] Assignee: Canon Kabushiki Kaisha, Tokyo, Japan

[21] Appl. No.: 08/783,846

[22] Filed: Jan. 16, 1997

[30] Foreign Application Priority Data

Jan. 17, 1996 [JP] Japan .................................. 8-005684

[51] Int. Cl.⁶ ...................................................... H01J 40/14
[52] U.S. Cl. ........................ 250/208.1; 250/216; 358/482
[58] Field of Search .................. 250/208.1, 239, 250/227.11, 227.32, 227.29, 227.2, 216; 362/16, 317, 228, 232, 277; 358/482, 484; 385/415; 235/455, 473

[56] References Cited

U.S. PATENT DOCUMENTS

| | | | |
|---|---|---|---|
| 4,818,861 | 4/1989 | Horiuchi et al. ................... | 250/227.32 |
| 5,182,445 | 1/1993 | Yamashita ............................ | 250/208.1 |
| 5,416,608 | 5/1995 | Ueda et al. ........................ | 250/227.11 |

*Primary Examiner*—Que T. Le
*Attorney, Agent, or Firm*—Fitzpatrick, Cella, Harper & Scinto

[57] ABSTRACT

There is provided an image reading system which can read an image at a high picture quality by having a plurality of light sources arranged on the same plane, an optical guide member for guiding lights irradiated from the plurality of light sources and almost uniformly irradiating an object in a line, a common converging member for converging the lights irradiated from the plurality of light sources so as to enter at least an almost same position in the longitudinal direction on the cross sectional surface of the optical guide member, a line-shaped photoelectric converting device for converting the light from the object irradiated by the optical guide member into an image signal, and a control unit for controlling the plurality of light sources and the photoelectric converting device.

43 Claims, 8 Drawing Sheets

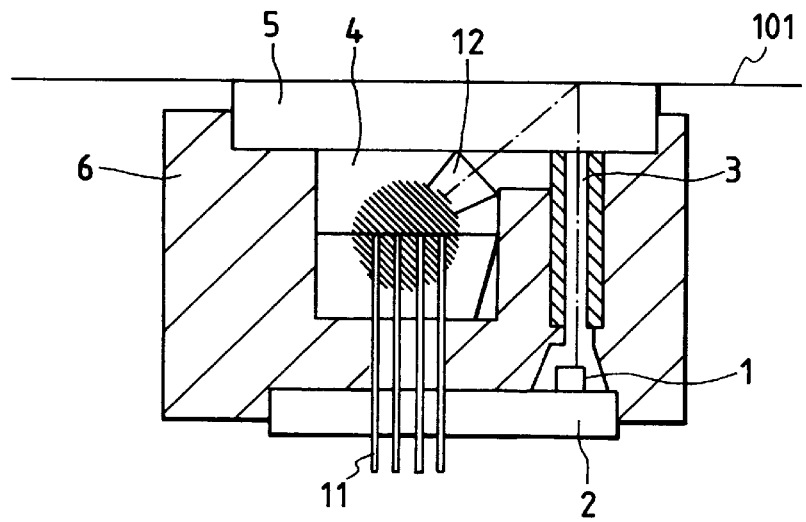
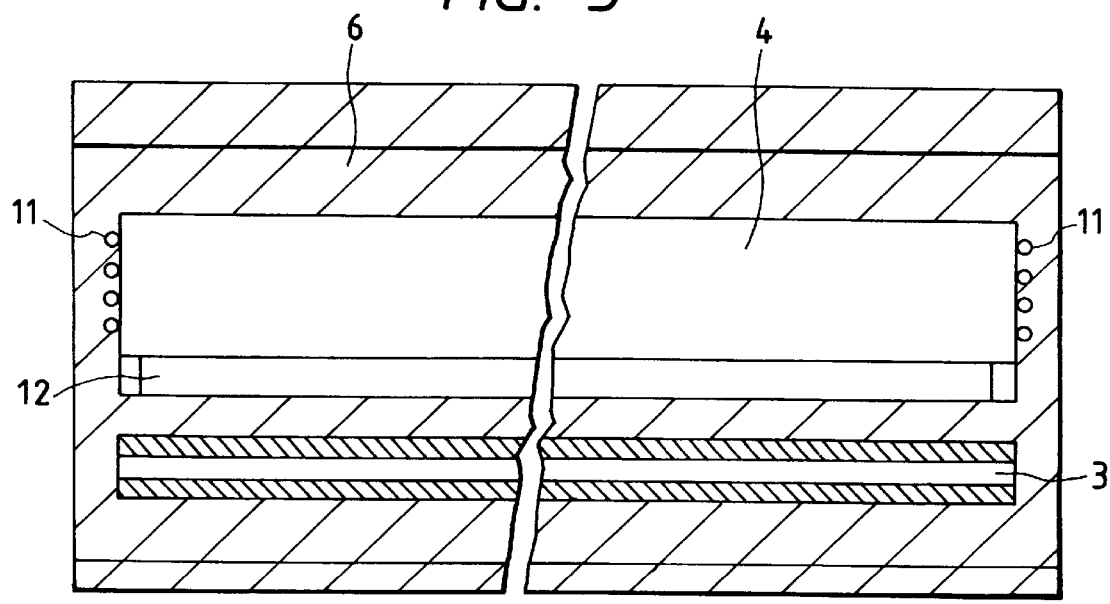

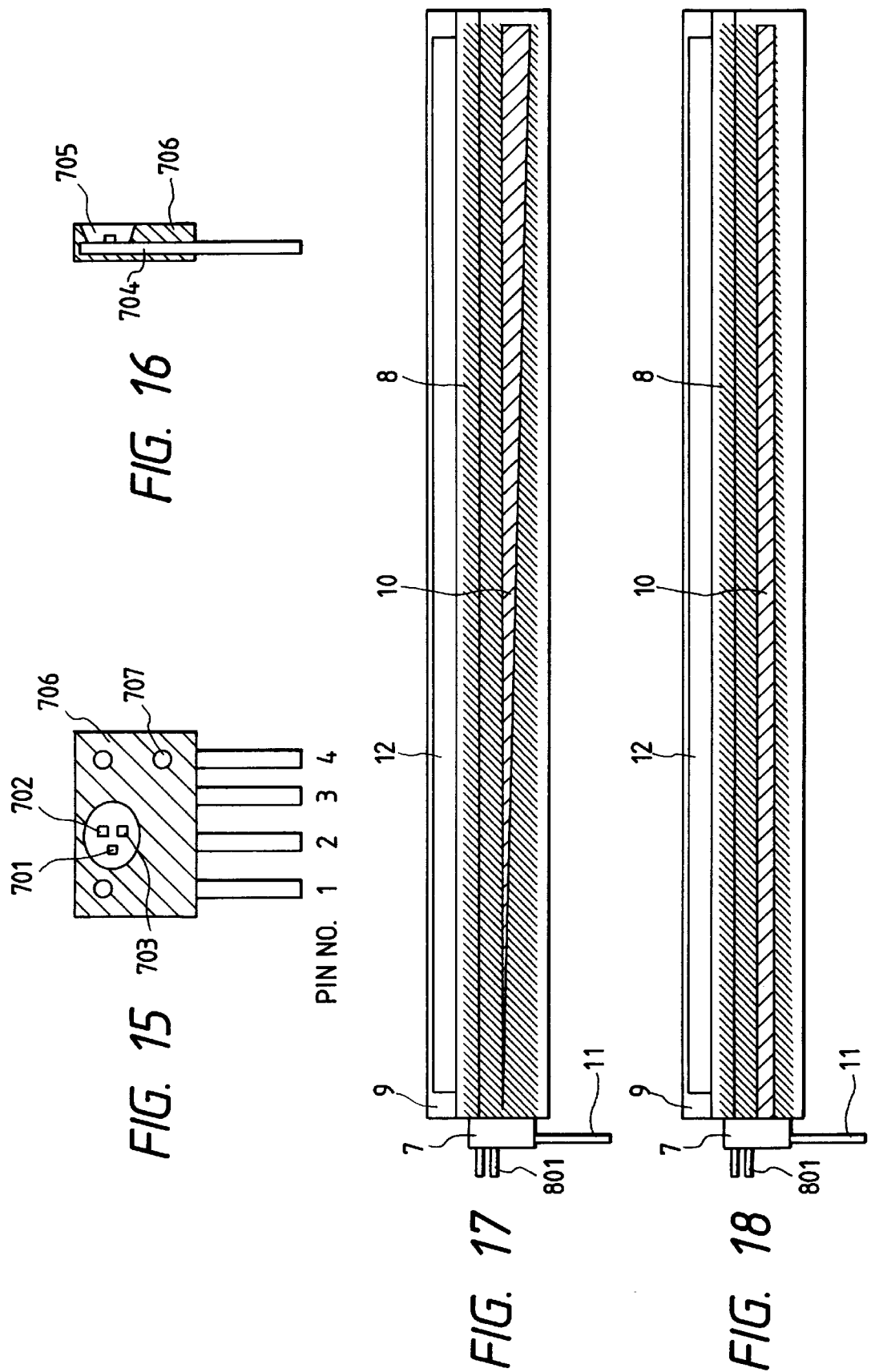

IMAGE READING SYSTEM WITH MEANS FOR CONVERGING LIGHT FROM A PLURALITY OF LIGHT SOURCES ON A SUBSTANTIALLY SAME POSITION TO UNIFORMLY IRRADIATE AN OBJECT

BACKGROUND OF THE INVENTION

1. Field of the Invention

The invention relates to an image reading system for reading an original image in an image scanner, a facsimile apparatus, or the like and, more particularly, the invention is suitable for use in an image reading system with a construction such that an original is illuminated by an irradiation light from an LED (light emitting diode) and an image of the original is photographed by a CCD (charge coupled device) one-dimensional image sensor.

2. Related Background Art

In a conventional image scanner or a facsimile, as an image reading system for reading an image on an original, there is a system as shown in a cross sectional view of FIG. 13. In FIG. 13, a sensor IC 1 is installed on a sensor board 2 and is positioned by a frame 6 together with a lens array 3, an LED array 18 serving as a light source to illuminate an original, and a cover glass 5.

The LED array 18 is constructed by arranging a plurality of red (R) LEDs 13, green (G) LEDs 14, and blue (B) LEDs 15 in a line onto an LED board 7 so as to have predetermined intervals as shown in FIG. 14.

Since it is necessary to uniformly irradiate the light over a whole width of an original to be read, the LED array 18 serving as a light source is constructed by at least about 30 LEDs with respect to each color of R, G, and B in order to irradiate the original of, for example, the A4 size.

In the conventional image reading system as mentioned above, however, in case of installing a number of LED devices of each color of R, G, and B onto the LED board, since the LED device is very expensive, an LED array using tens of LEDs becomes a largest cause of an increase in costs in the whole system.

According to an illuminance distribution on the original surface illuminated by the LED array, since a portion corresponding to the top of the LED is bright and a portion between the LEDs is dark, peaks of only the number of LEDs appear. Therefore, when the original of a uniform density is read, an output between the adjacent sensor devices are steep and it is necessary to correct the sensor output with respect to all of the bits of the sensor device. Particularly, in case of a color image sensor, a correcting circuit to correct each sensor output is needed with regard to each of three colors of R, G, and B. Not only a circuit construction is complicated but also it becomes a cause of a further increase in costs.

SUMMARY OF THE INVENTION

It is an object of the invention to provide an image reading system which can read an image of a high picture quality at a high speed.

Another object of the invention is to provide a compact image reading system which can read an image of a high picture quality at a high speed.

Still another object of the invention is to provide an illumination which can obtain a uniform irradiation light without unevenness.

To accomplish the above objects, according to an embodiment of the invention, there is provided an image reading unit comprising: a plurality of light sources arranged on a same plane; optical guide means for guiding lights irradiated from the plurality of light sources and almost uniformly irradiating an object in a line; common light converging means for converging the lights irradiated from the plurality of light sources so as to enter at least an almost same position in the longitudinal direction on a cross sectional surface of the optical guide means; and line-shaped photoelectric converting means for converting the light from the object irradiated by the optical guide means into an image signal.

With the above construction, the image reading unit can be miniaturized and an image of a high picture quality can be read.

According to another embodiment of the invention, an illuminating unit for irradiating an object in a line comprises: a plurality of light sources arranged on a same plane; optical guide means for guiding lights irradiated from the plurality of light sources and almost uniformly irradiating the object in a line; and common light converging means for converging the lights irradiated from the plurality of light sources so as to enter at least an almost same position in the longitudinal direction on a cross sectional surface of the optical guide means.

With such a construction, a uniform line-shaped irradiation light can be obtained while reducing the number of light sources to be used and the costs can be reduced.

According to further another embodiment of the invention, an image reading system comprises: a plurality of light sources arranged on a same plane; optical guide means for guiding lights irradiated from the plurality of light sources and almost uniformly irradiating an object in a line; common light converging means for converging the lights irradiated from the plurality of light sources so as to enter at least an almost same position in the longitudinal direction on a cross sectional surface of the optical guide means; line-shaped photoelectric converting means for converting the light from the object irradiated by the optical guide means into an image signal; and control means for controlling the plurality of light sources and the photoelectric converting means.

With such a construction, the whole system can be miniaturized and an image of a high picture quality can be read.

The above and other objects and features of the present invention will become apparent from the following detailed description and the appended claims with reference to the accompanying drawings.

BRIEF DESCRIPTION OF THE DRAWINGS

FIG. 2 is a cross sectional view of a reading unit in the image reading system according to the embodiment;

FIG. 3 is a top view of the reading unit in the image reading system according to the embodiment;

FIG. 15 is a top view of a LED light source of case-mold type, of the embodiment of the present invention;

FIG. 16 is a cross sectional view of the LED light source of case-mold type, of the embodiment of the present invention;

FIG. 17 is a side elevational view of a illuminating apparatus to which a color LED light source of case-mold type, of the embodiment is mounted; and FIG. 18 is a side elevational view of a illuminating apparatus to which a color LED light source of case-mold type, of the embodiment is mounted.

DETAILED DESCRIPTION OF THE PREFERRED EMBODIMENTS

Figure 1:
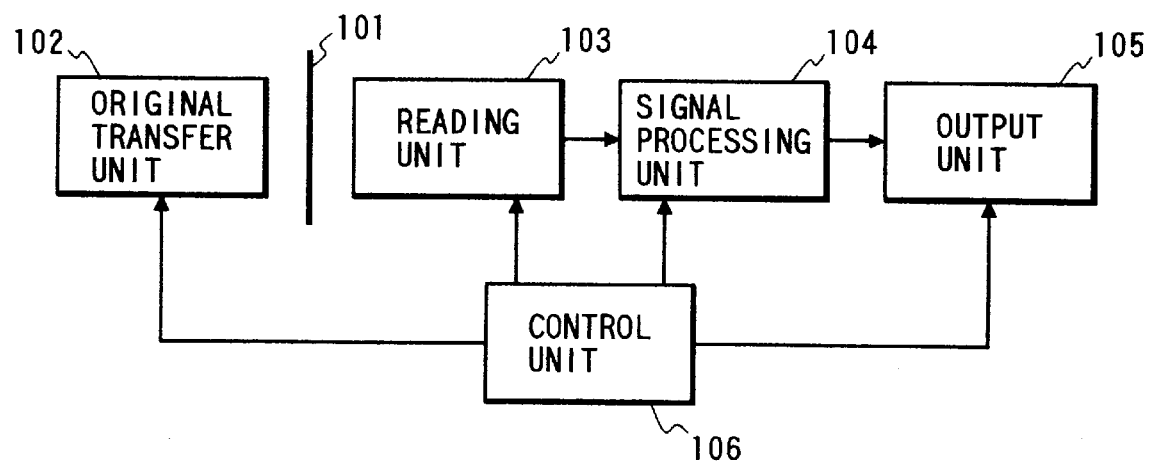
FIG. 1 is a constructional block diagram of an image reading system according to an embodiment.

An embodiment of the present invention will now be described hereinbelow with reference to the drawings. FIG. 1 is a constructional diagram of an image reading system to which the invention is embodied. The construction can be applied to an image scanner, a facsimile, a copying apparatus, or the like.

As shown in FIG. 1, the image reading system is constructed by an original transfer unit 102, a reading unit 103, a signal processing unit 104, an output unit 105, and a control unit 106 to control the whole system.

FIGS. 2 and 3 are diagrams for explaining in detail the reading unit 103 in the image reading system described in FIG. 1. FIG. 2 is a cross sectional view and FIG. 3 is a top view.

As shown in FIG. 2, the reading unit 103 has: a sensor board 2 made of a glass epoxy resin material or the like on which the sensor ICs 1 each comprising a group of photoelectric converting elements serving as photoelectric converting means are accurately arranged in a line in correspondence to a length of original as an object to be read; the lens array 3; an illuminating unit 4; and the cover glass 5 made of a light transmitting material for supporting the original. Those component members are positioned and held by the frame 6 made of a metal such as aluminum or the like or a resin material such as polycarbonate or the like.

The reading operation of a color image in the image reading system will now be described. An original 101 supported by the cover glass 5 is transferred by the original transfer unit 102 and an image on the original is read by the reading unit 103. The control unit 106 controls in a manner such that the LEDs of R, G, and B of the illuminating unit 4 are switched so as to be sequentially lit on and the lights of three colors of R, G, and B are sequentially irradiated onto the original 101 from an oblique direction of about 45°. The lights of three colors reflected by the original 101 are guided onto the sensor IC 1 by the lens array 3. The guided light information is converted into image signals of three colors of R, G, and B. The image signals of three colors outputted from the reading unit 103 are supplied to the signal processing unit 104, by which an adjustment of signal levels and processes such as shading correction, gamma correction, color correction, and the like are executed to the image signals, respectively. The image signals which were subjected to those various processes are outputted from the output unit 105 to the outside.

Figure 4:
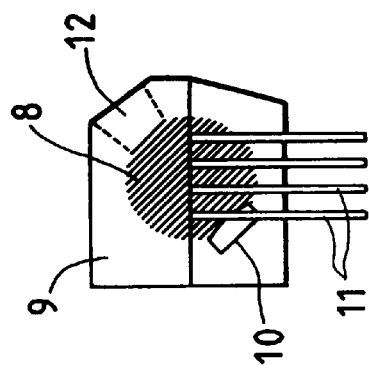
FIG. 4 is a cross sectional view of an illuminating unit in the reading unit of the embodiment.
Figure 5:
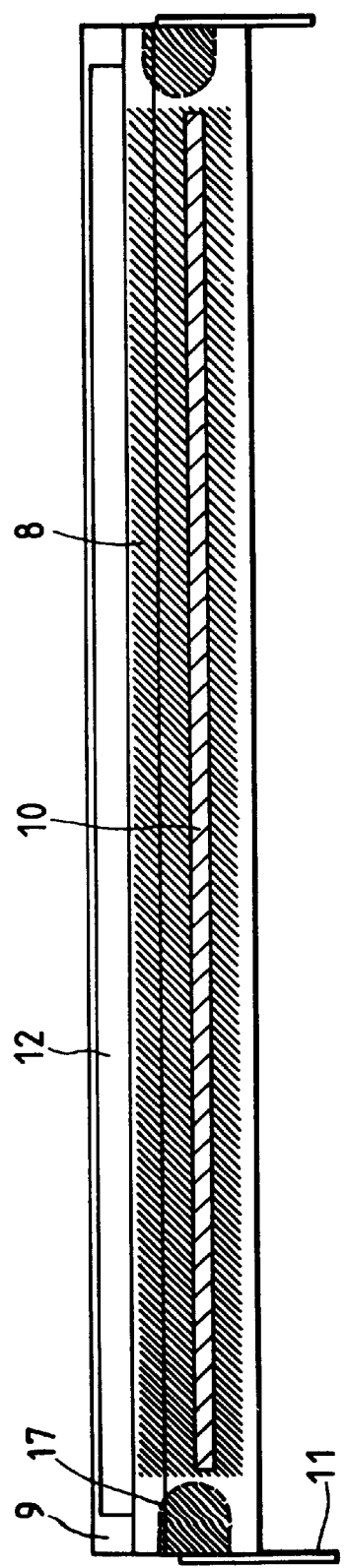
FIG. 5 is a side elevational view of the illuminating unit in the reading unit of the embodiment.

A construction of the illuminating unit 4 will now be described in detail. FIG. 4 is a cross sectional view of the illuminating unit 4. FIG. 5 is a side elevational view. The illuminating unit 4 is constructed by: LED units 17 of three colors of R, G, and B of a lead frame type serving as light sources which were packaged by a cannonball-shaped light transmitting resin as light converging means; a cylindroid optical guide member 8 serving as optical guide means made of a light transmitting material such as an acrylic resin or the like; and a housing 9 having a hexagonal cross sectional shape for positioning and holding the LED units 17 and optical guide member 8. The LED units 17 are arranged in both edge portions of the optical guide member 8 and input lights from both sides toward the inside of the optical guide member 8. A cavity is formed between the LED unit 17 and optical guide member 8, thereby allowing the light irradiated from the LED unit 17 to be converged to and enter at least almost the same position in the longitudinal direction of a cross sectional surface of the optical guide member. In the case where the optical guide member has a circular cross section as in the embodiment, by converging the light to the center portion, the original can be irradiated by the more uniform light.

According to the conventional LED devices of B and G, luminances are lower than that of the LED device of R by a degree of one digit or more. However, owing to the recent remarkable development of the LED technique, the LED devices of B and G having a high luminances similar to that of the LED device of R have been put into practical use, so that such a construction can be used.

Figure 6:
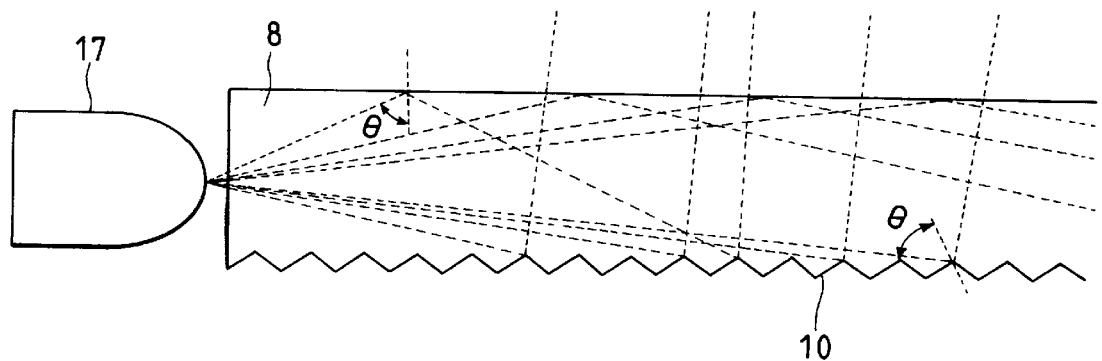
FIG. 6 is a detailed diagram of an optical guide member in the reading unit of the embodiment.

A diffusion surface 10 to irradiate the light in the direction different from the optical guiding direction is provided for the optical guide member 8. As shown in an enlarged diagram of FIG. 6, fine saw-toothed shapes are continuously formed on the diffusion surface 10 in the longitudinal direction of the optical guide member 8. The light which entered the saw-toothed surface at an incident angle θ of 41° or more (in the case where the optical guide member is made of an acrylic resin and a refractive index n=1.5) satisfies total reflection angle conditions and is emitted in a desired direction. Further, since a pitch of the saw-toothed surfaces is very fine to be 1 (mm) or less, a uniform illuminance distribution is derived in a short range of the original. There is hardly an output difference between the adjacent sensor devices when the original of a uniform density is read.

In addition, the diffusion surface 10 may be formed by printing a light diffusion member such as white ink, for example, on the optical guide member 8 instead of forming the saw-toothed shapes on the member 8.

Subsequently, the following explanation is provided for a structure which can illuminate an original surface by uniform light, even if a cannonball-shaped LED package which does not have light convergence characteristic, is used.

As a light source which does not have the light convergence characteristic, a top view and a cross sectional view of a color LED light source of case-mold type are shown in FIGS. 15 and 16 respectively. Referring to FIGS. 15 and 16, the LED light source is injection-molded by inserting a lead frame 704 into a metal mold, thereby a portion of the lead frame 704, except for a portion mounted on a LED element, is covered by a white resin 706 which well reflects light, cathodes of the LED elements 701, 702 and 703 of three colors R, G and B are connected to a common base pin of the lead frame 704 and anodes are connected to exclusive-use pins of the respective colors of the lead frame 704, and a light transmitting resin 705 is potted on the LED elements of the three colors.

Embodiments of an illumination apparatus 4 to which the color LED light source of case-mold type is mounted, are shown in FIGS. 17 and 18.

In the embodiment shown in FIG. 17, in order to illuminate the original surface uniformly, the diffusion surface 10 has narrower width near the light source, and this width becomes larger as distance from the light source increases.

In the embodiment shown in FIG. 18, in order to attain the same objective as the embodiment shown in FIG. 17, the area of the optical guide member 8 is reduced as the distance from the light source increases, while the width of the diffusion surface 10 is not changed.

A method of fixing the LED light source of case-mold type is as follows: A locating pin 801 of the optical guide member 8 is inserted into a locating hole 707 and then the locating pin 801 is caulked with heat, ultrasonic wave and et. al, so that the light source can be precisely located.

The LED units 17 and optical guide member 8 are positioned and held by the housing 9. A slit 12 to transmit the light which was guided by the optical guide member 8 and irradiated by the diffusion surface 10 is formed on one side of the hexagonal cross section of the housing 9, thereby preventing that the light is transmitted in the other directions. As a color of the housing 9, white having a high light reflecting efficiency is preferable in order to obtain a large light quantity. For example, the housing 9 is made of a material such as an ABS resin or the like.

Figure 7:
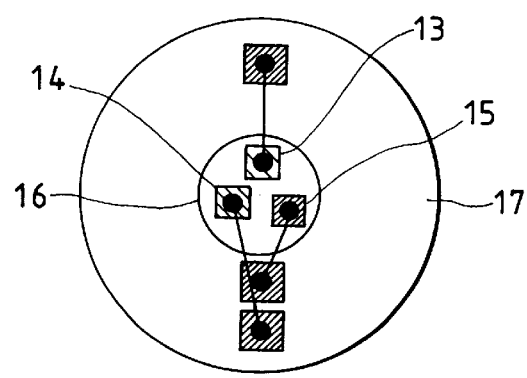
FIG. 7 is cross sectional view of an LED unit in the illuminating unit of the embodiment.
Figure 8:
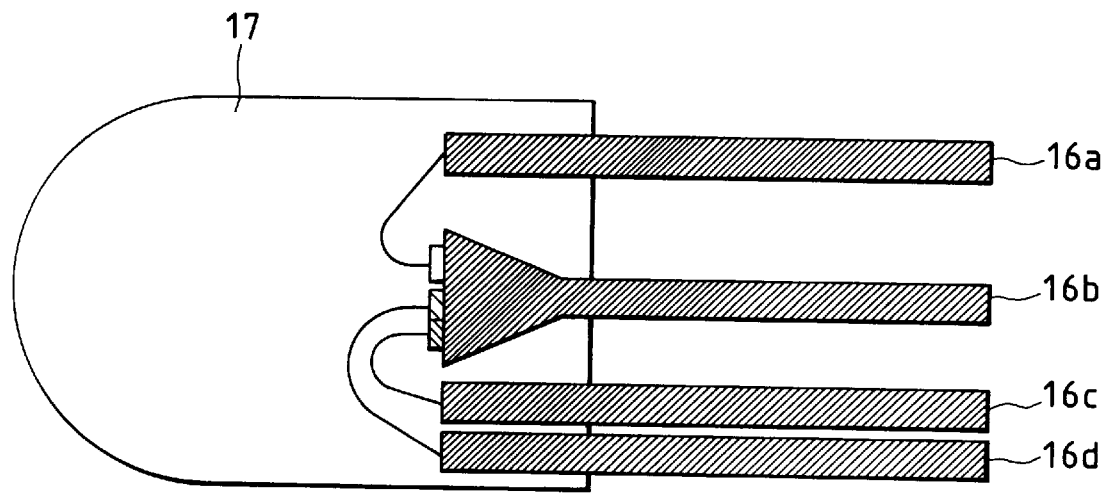
FIG. 8 is a side elevational view of the LED unit in the illuminating unit of the embodiment.
Figure 9:
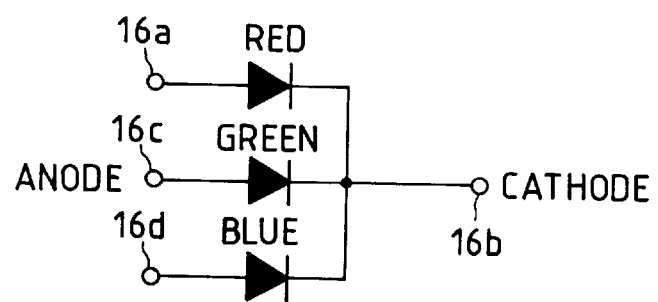
FIG. 9 is an equivalent circuit diagram of the LED unit in the illuminating unit of the embodiment.

FIG. 7 shows a cross sectional view of the LED unit 17, FIG. 8 shows a side elevational view, and FIG. 9 shows an equivalent circuit. Cathodes of the LED devices 13, 14, and 15 of R, G, and B are connected to a common base pin 16*b* of a lead frame 16 and anodes are connected to exclusive-use pins 16*a*, 16*c*, and 16*d* of the respective colors of the lead frame 16. The LEDs 13, 14, and 15 are packaged by a cannonball-shaped light transmitting resin which can efficiently guide the lights irradiated from the LED devices and has a strong directivity, thereby constructing the LED unit 17. Since the LED devices 13, 14, and 15 are arranged on the same plane, the LED unit 17 has a very compact size.

A method of assembling the reading unit will now be described. First, the lens array 3 and illuminating unit 4 are respectively inserted to predetermined positions of the frame 6. In this instance, three sides of the hexagonal cross sectional surface of the housing 9 of the illuminating unit 4 inserted collide with the surface perpendicular to the horizontal surface in the frame 6, respectively, so that the positioning in the rotating direction of an optical axis can be precisely performed. The cover glass 5 is adhered by an adhesive agent or the like to two surfaces in the longitudinal direction of the frame 6 which was set in a form so as to sandwich the illuminating unit 4 and lens array 3 on a plane that is approximately the same as the upper surface of the illuminating unit 4 and lens array 3 which were inserted into the frame 6.

Since the upper surface of the illuminating unit 4 is a horizontal surface, it is approximately come into contact with the surface of the cover glass 5 in parallel and the frame 6 and cover glass 5 are adhered, thereby enabling the illuminating unit 4 to be fixed without a loose. Thereby completing an assembling work.

By reducing the number of LEDs of each color of R, G, and B by constructing as mentioned above, the costs can be remarkably reduced. Since the indirect illumination using the optical guide member is performed, an illuminance variation on the original surface of every LED which occurs in case of the direct illumination doesn't occur. The correcting circuit of the sensor output in case of reading the original of the uniform density can be simplified. Further, since the illuminating unit in which the LEDs are enclosed in the cannonball-shaped package having a strong directivity is used as a light source, the light can be efficiently guided, the illuminance on the original surface can be raised, and the original image can be read at a high resolution and a high speed.

Figure 10:
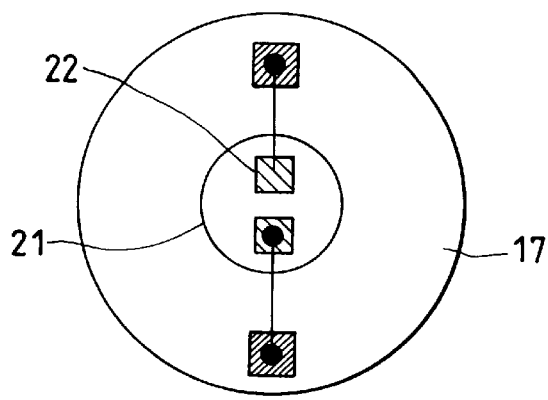
FIG. 10 is a cross sectional view of the LED unit in the illuminating unit of the embodiment.
Figure 11:
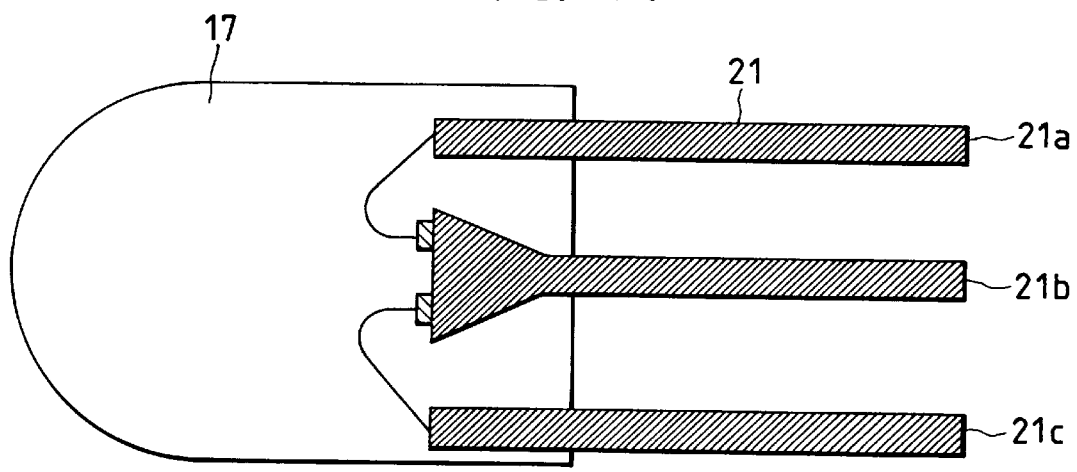
FIG. 11 is a side elevational view of the LED unit in the illuminating unit of the embodiment.
Figure 12:
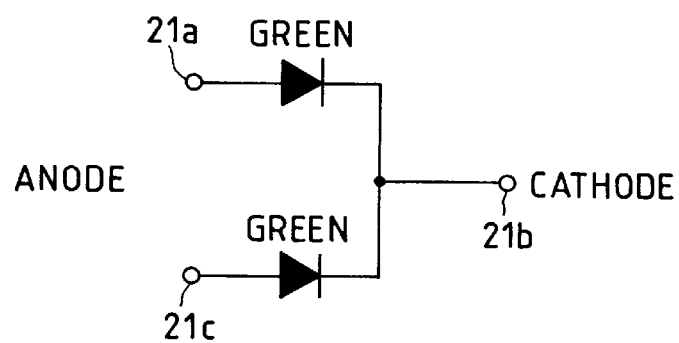
FIG. 12 is an equivalent circuit diagram of the LED unit in the illuminating unit of the embodiment.
Figure 13:
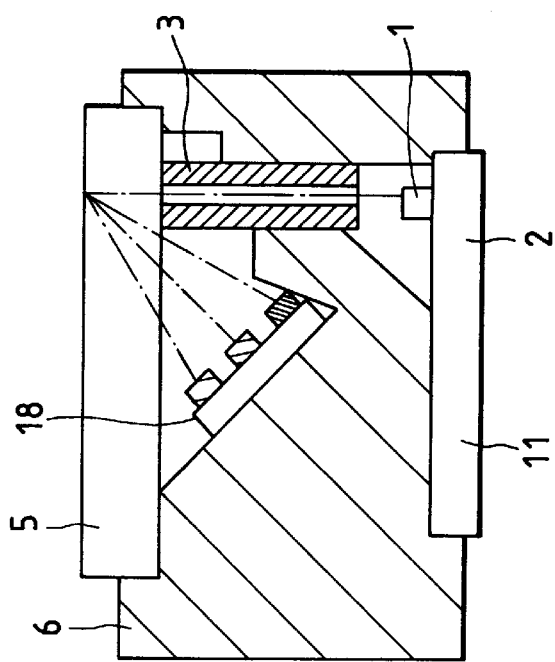
FIG. 13 is a cross sectional view of a reading unit in a conventional image reading system.
Figure 14:
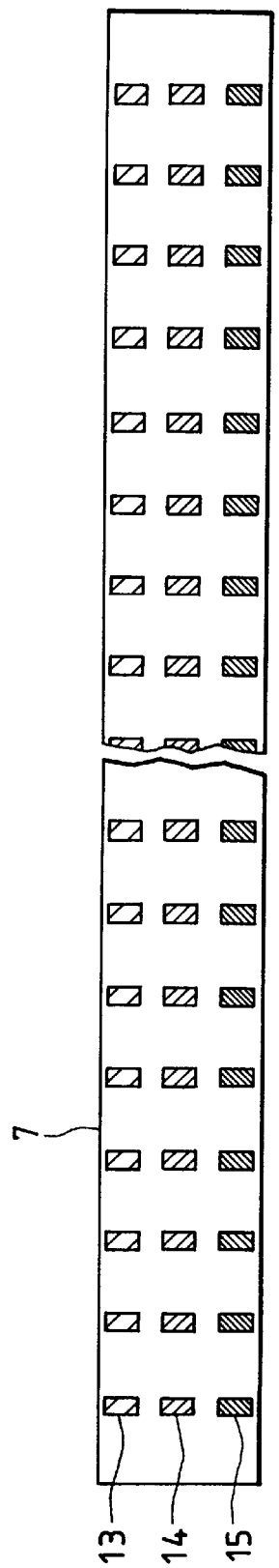
FIG. 14 is a top view of an LED array in the conventional image reading system.

Although the example of the color image sensors of three colors of R, G, and B has been shown and described in the above embodiment, the color image sensors of other colors such as cyan, magenta, and yellow can be also used. It will be also obviously understood that the packaging as shown in the embodiment can be used from a viewpoint of an increase in illuminance with respect to black and white image reading systems each using a light source in which a plurality of monochromatic LEDs 22 are packaged as shown in FIGS. 10, 11, and 12.

By constructing as described above, a plurality of light sources are arranged on the same plane, so that the light source can be formed in a compact size and the system can be miniaturized. By reducing the number of light sources, the costs can be remarkably reduced. Since the lights from a plurality of light sources are converged and inputted to at least an almost same position in the longitudinal direction on the cross sectional surface of the optical guide means, the object can be uniformly irradiated in a line without causing an illuminance variation. Further, since the lights from a plurality of light sources are converged by the common converging means, the lights are efficiently converged, the illuminance of the object is raised, and the original image can be read at a high resolution and a high speed.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image reading unit comprising:

(a) a plurality of light sources arranged on a same plane;

(b) converging means for converging light beams irradiated from said plurality of light sources substantially on a single position to form convergent light;

(c) optical guide means for guiding the convergent light converged by said converging means to substantially uniformly irradiate the light beams from said plurality of light sources onto an object in a line; and (d) line-shaped photoelectric converting means for converting the light from the object irradiated by said optical guide means into an image signal.

2. A unit according to claim 1, wherein said plurality of light sources and said converging means are provided at edge portions of said optical guide means.

3. A unit according to claim 2, wherein said plurality of light sources and said converging means are provided at two edge portions of said optical guide means.

4. A unit according to claim 1, wherein said plurality of light sources and said converging means are provided at two edge portions of said optical guide means.

5. A unit according to claim 4, wherein said converging means is formed by a light transmitting resin and said plurality of light sources are packaged.

6. A unit according to claim 5, wherein said converging means has a cannonball-shape.

7. A unit according to claim 1, wherein said optical guide means has a reflecting unit for reflecting the guided light in the irradiating direction of the object.

8. A unit according to claim 1, wherein each of said plurality of light sources can be individually lit.

9. A unit according to claim 8, wherein said plurality of light sources can be sequentially lit.

10. A unit according to claim 1, wherein each of said plurality of light sources have identical spectral characteristics.

11. A unit according to claim 1, wherein each of said plurality of light sources have different spectral characteristics.

12. A unit according to claim 11, wherein said plurality of light sources have spectral characteristics of red, green, and blue.

13. A unit according to claim 11, wherein said plurality of light sources have spectral characteristics of cyan, magenta, and yellow.

14. A unit according to claim 1, wherein said plurality of light sources are LEDs.

15. An illuminating unit for irradiating an object in a line, comprising:

(a) a plurality of light sources arranged on a same plane;

(b) converging means for converging light beams irradiated from said plurality of light sources substantially on a single position to form convergent light; and (c) optical guide means for guiding the convergent light converged by said converging means to substantially uniformly irradiate the light beams from said plurality of light sources onto the object in a line.

16. A unit according to claim 15, wherein said plurality of light sources and said converging means are provided at edge portions of said optical guide means.

17. A unit according to claim 16, wherein said plurality of light sources and said converging means are provided at two edge portions of said optical guide means.

18. A unit according to claim 15, wherein said plurality of light sources and said converging means are provided at two edge portions of said optical guide means.

19. A unit according to claim 18, wherein said converging means is formed by a light transmitting resin and said plurality of light sources are packaged.

20. A unit according to claim 19, wherein said converging means has a cannonball shape.

21. A unit according to claim 15, wherein said optical guide means has a reflecting unit for reflecting the guided light in the irradiating direction of the object.

22. A unit according to claim 15, wherein each of said plurality of light sources can be individually lit.

23. A unit according to claim 22, wherein said plurality of light sources can be sequentially lit.

24. A unit according to claim 15, wherein each of said plurality of light sources have identical spectral characteristics.

25. A unit according to claim 15, wherein each of said plurality of light sources have different spectral characteristics.

26. A unit according to claim 25, wherein said plurality of light sources have spectral characteristics of red, green, and blue.

27. A unit according to claim 25, wherein said plurality of light sources have spectral characteristics of cyan, magenta, and yellow.

28. A unit according to claim 15, wherein said plurality of light sources are LEDs.

29. An image reading system comprising:

(a) a plurality of light sources arranged on a same plane;

(b) converging means for converging light beams irradiated from said plurality of light sources substantially on a single position to form convergent light;

(c) optical guide means for guiding the convergent light converged by said converging means to substantially uniformly irradiate the light beams from said plurality of light sources onto an object in a line;

(d) line-shaped photoelectric converting means for converting the light from the object irradiated by said optical guide means into an image signal; and (e) control means for controlling said plurality of light sources and said photoelectric converting means.

30. A system according to claim 29, wherein said plurality of light sources and said converging means are provided at edge portions of said optical guide means.

31. A system according to claim 30, wherein said plurality of light sources and said converging means are provided at two edge portions of said optical guide means.

32. A system according to claim 29, wherein said plurality of light sources and said converging means are provided at two edge portions of said optical guide means.

33. A system according to claim 32, wherein said converging means is formed by a light transmitting resin and said plurality of light sources are packaged.

34. A system according to claim 33, wherein said converging means has a cannonball shape.

35. A system according to claim 29, wherein said optical guide means has a reflecting unit for reflecting the guided light in the irradiating direction of said object.

36. A system according to claim 29, wherein each of said plurality of light sources can be individually lit.

37. A system according to claim 36, wherein said plurality of light sources can be sequentially lit.

38. A system according to claim 29, wherein each of said plurality of light sources have identical spectral characteristics.

39. A system according to claim 29, wherein each of said plurality of light sources have different spectral characteristics.

40. A system according to claim 39, wherein said plurality of light sources have spectral characteristics of red, green, and blue.

41. A system according to claim 39, wherein said plurality of light sources have spectral characteristics of cyan, magenta, and yellow.

42. A system according to claim 29, wherein said control means further controls so as to independently light said plurality of light sources.

43. A system according to claim 29, wherein said plurality of light sources are LEDs.

* * * * *

UNITED STATES PATENT AND TRADEMARK OFFICE
CERTIFICATE OF CORRECTION

PATENT NO.    : 5,965,870
DATED         : October 12, 1999
INVENTOR(S)   : MASAMI TABATA It is certified that error appears in the above-identified patent and that said Letters Patent is hereby corrected as shown below:

AT [57] ABSTRACT

Line 11, "cross sectional" should read --cross-sectional--.

COLUMN 1

Line 20, "cross sectional" should read --cross-sectional--.

COLUMN 2

Line 7, "cross sectional" should read --cross-sectional--;
Line 22, "cross sectional" should read --cross-sectional--;
Line 35, "cross sectional" should read --cross-sectional--;
Line 52, "cross sectional" should read --cross-sectional--;
Line 57, "cross sectional" should read --cross-sectional--; and
Line 63, "cross sectional" should read --cross-sectional--.

UNITED STATES PATENT AND TRADEMARK OFFICE
CERTIFICATE OF CORRECTION

PATENT NO.    : 5,965,870

DATED         : October 12, 1999

INVENTOR(S)   : MASAMI TABATA

It is certified that error appears in the above-identified patent and that said Letters Patent is hereby corrected as shown below:

COLUMN 3

Line 3, "cross sectional" should read --cross-sectional--;
    Line 11, "cross sectional" should read --cross-sectional--;
    Line 16, "cross sectional" should read --cross-sectional--; and
    Line 41, "cross sectional" should read --cross-sectional--.

COLUMN 4

Line 9, "cross sectional" should read --cross-sectional--;
    Line 17, "cross sectional" should read --cross-sectional--;
    Line 26, "cross sectional" should read --cross-sectional--;
    Line 49, "1 (mm)" should read --1 mm--; and
    Line 63, "cross sectional" should read --cross-sectional--.

UNITED STATES PATENT AND TRADEMARK OFFICE
CERTIFICATE OF CORRECTION

PATENT NO. : 5,965,870

DATED : October 12, 1999

INVENTOR(S) : MASAMI TABATA

It is certified that error appears in the above-identified patent and that said Letters Patent is hereby corrected as shown below:

COLUMN 5

Line 24, "and" should be deleted;
    Line 36, "cross sectional" should read --cross-sectional--;
    Line 52, "cross" should read --cross- --; and
    Line 65, "is" should be deleted, and "come" should read --comes--.

COLUMN 6

Line 1, "without a loose." should read --without being loose.--; and
    Line 32, "cross" should read --cross- --.

Signed and Sealed this

Nineteenth Day of September, 2000

Q. TODD DICKINSON

Attest:

Attesting Officer     Director of Patents and Trademarks